(12) United States Patent
Barrenscheen

(10) Patent No.: US 8,358,229 B2
(45) Date of Patent: Jan. 22, 2013

(54) METHOD FOR USE IN A SIGMA-DELTA ANALOG TO DIGITAL CONVERTER, SIGMA-DELTA ANALOG TO DIGITAL CONVERTERS AND SYSTEMS COMPRISING A SIGMA-DELTA ANALOG TO DIGITAL CONVERTER

(75) Inventor: Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 13/036,203

(22) Filed: Feb. 28, 2011

(65) Prior Publication Data

US 2012/0218134 A1 Aug. 30, 2012

(51) Int. Cl.
*H03M 3/00* (2006.01)
*G06F 17/17* (2006.01)

(52) U.S. Cl. .......................... 341/143; 341/61; 708/313

(58) Field of Classification Search ................... 341/61, 341/143; 708/290, 313
See application file for complete search history.

(56) References Cited

U.S. PATENT DOCUMENTS

| | | | | |
|---|---|---|---|---|
| 4,020,332 A | * | 4/1977 | Crochiere et al. | 708/290 |
| 2004/0210578 A1 | * | 10/2004 | Taitel | 707/8 |
| 2010/0299380 A1 | * | 11/2010 | Warrington | 708/290 |

* cited by examiner

*Primary Examiner* — Howard Williams
(74) *Attorney, Agent, or Firm* — Eschweiler & Associates, LLC

(57) ABSTRACT

Some embodiments relate to a method for use in a sigma-delta analog to digital converter, sigma-delta analog to digital converters and systems comprising sigma-delta analog to digital converters. In accordance with an aspect of the invention, there is provided a method for use in a sigma-delta analog to digital converter (SD-ADC) comprising a modulator, a decimation filter, a decimation counter, and a decimator data output, wherein the method comprises receiving an external trigger signal and capturing a value of the decimation counter and a value of the decimator data output upon receiving the external trigger signal.

26 Claims, 10 Drawing Sheets

METHOD FOR USE IN A SIGMA-DELTA ANALOG TO DIGITAL CONVERTER, SIGMA-DELTA ANALOG TO DIGITAL CONVERTERS AND SYSTEMS COMPRISING A SIGMA-DELTA ANALOG TO DIGITAL CONVERTER

FIELD

Aspects of this disclosure relate to a method for use in a sigma-delta analog to digital converter, sigma-delta analog to digital converters and systems comprising sigma-delta analog to digital converters.

BACKGROUND

Exemplary sigma-delta (or: delta-sigma) analog to digital converters (SD-ADCs) are often employed to continuously capture measuring data. As the SD-ADC measuring process involves integration of a plurality of samples over a time window of a certain length, the sigma-delta (SD) method does not allow direct generation of a measuring value which corresponds to one certain point in time, but to a certain measurement time window. In order to establish a timing relation between these measurement windows and other tasks in the system, the generated data is supplied with a corresponding time stamp indicating the generation time of the respective value and each value is stored together with its corresponding time stamp. To extend a value generation over larger measurement windows, an additional integrator can be used to integrate over a defined number of decimation results, wherein a decimation result is a result of a respective measurement window.

If a measuring value is required at a certain point within a time window between two SD-ADC values generated subsequently, the required value may be calculated by linear interpolating or extrapolating two SD-ADC values generated subsequently. For this purpose, the time at which a value is required has to be captured and stored so that it can be related to the points of time at which the two "nearest" SD-ADC values have been generated. For example, if measuring values are required periodically and the time periods of these required values are shorter than the time periods of the generated SD-ADC values, calculation of "in-between" or intermediate values is continuously required.

This, however, requires specially adapted hardware and respective connections in the system so that, in general, custom-made modules have to be used instead of generic modules. In particular, three direct memory access (DMA) channels are required for moving data from different modules to memory (ADC value and two timer values), wherein each DMA channel takes a large amount of chip area and, thus, is very costly.

Therefore, among other needs, there exists a need for a system for providing SD-ADC values and timer values required for calculating intermediate SD-ADC values which takes a reduced amount of chip area without involving significant loss of accuracy and/or resolution.

BRIEF SUMMARY

In accordance with an aspect of the invention, there is provided a sigma-delta analog to digital converter (SD-ADC) comprising a modulator, a decimation filter, a decimation counter provided with a first capture function element, and a decimator data output provided with a second capture function element, wherein the first capture element captures a value of the decimation counter when triggered by an external trigger signal and the second capture element captures a value of the decimator data output when triggered by the external trigger signal.

In accordance with a further aspect of the invention, there is provided a method for use in a sigma-delta analog to digital converter (SD-ADC) comprising a modulator, a decimation filter, a decimation counter, and a decimator data output, wherein the method comprises receiving an external trigger signal and capturing a value of the decimation counter and a value of the decimator data output upon receiving the external trigger signal.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1:
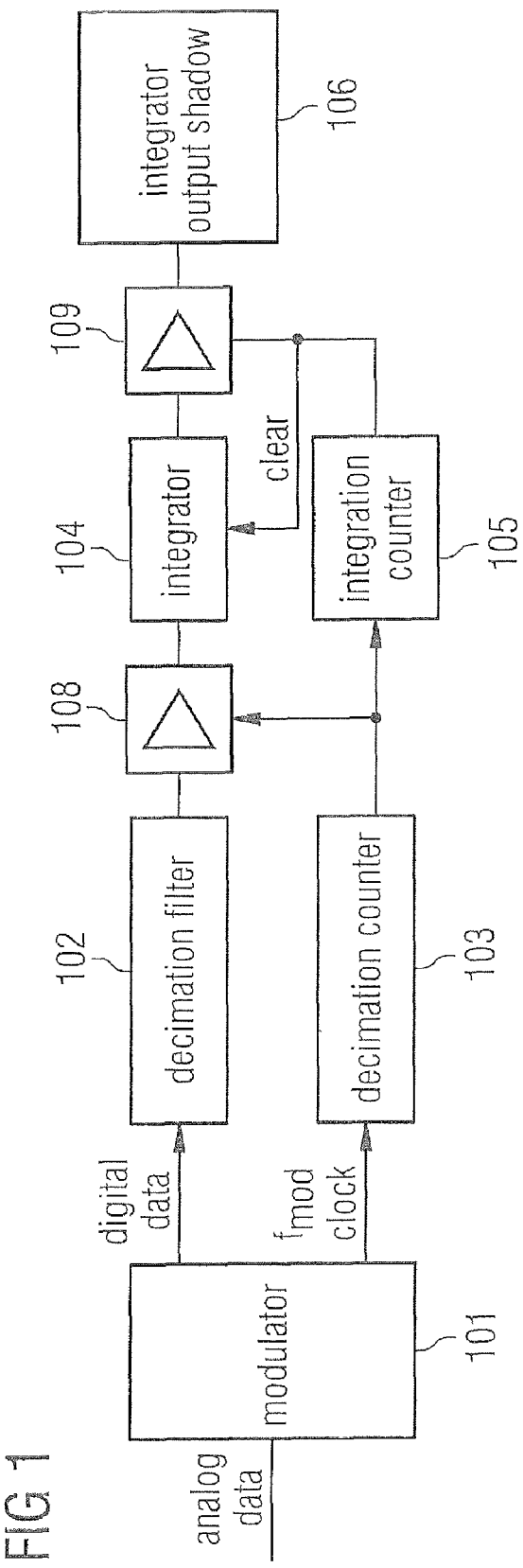
FIG. 1 shows a simplified diagram of an exemplary sigma-delta analog to digital converter (SD-ADC).

FIG. 1 shows a simplified diagram of an exemplary sigma-delta (or: delta-sigma) analog to digital converter (SD-ADC). The illustrated exemplary SD-ADC comprises a modulator 101, a decimation filter 102 provided with a first capture function element 108, a decimation counter 103, an integrator 104 provided with a second capture function element 109, an integration counter 105, and an integrator output shadow 106.

Herein, a "capture function element" refers to a circuit which continuously receives signals (e.g. data signals) at its input. Only when triggered by a suitable trigger signal received at its trigger input, the capture function element holds ("freezes") and outputs the currently or rather lastly received signal. In a way, a capture function element may be considered as the digital equivalent to an analog sample and hold circuit.

The modulator 101 has its outputs connected to the input of the decimation filter 102 and the input of the decimation counter 103. The output of the decimation counter 103 is connected to an input of the first capture function element 108 and the input of the integration counter. The output of the decimation filter 102 is connected to an input of the integrator 104 via the first capture function element 108 which is triggered by the output of the decimation counter. The output of the integration counter 105 is connected to an input of the integrator and an input of the second capture function element 109. The output of the integrator 104 is connected to the integrator output shadow 106 via the second capture function element 109 which is triggered by the output of the integration counter 105.

The decimation filter 102 continuously receives samples (i.e. data) from the modulator 101 and generates a decimated sample based on a predetermined number of received samples wherein the number is defined by the oversampling rate of the SD-ADC. For this, the decimation filter 102 is triggered by the output of the decimation counter 103.

The decimation counter 103 receives a clock frequency of the modulator 101, $f_{MOD}$, and, based on an oversampling rate (OSR), triggers the output of a decimated sample. In other words, the decimation counter 103 "counts" the samples received by the decimation filter 102 from the modulator 101 and triggers the output of a decimated sample when a predetermined number of samples has been received by the decimation filter 102.

The integrator 104 receives the decimated samples from the decimation filter 102 and integrates over the decimated samples.

The integration counter 105 also receives the trigger signals output by the decimation counter 103. When the integration counter 105 has received a predetermined number of trigger signals from the decimation counter 103, the integration counter 105 outputs a further trigger signal which causes a transfer of the current integration value to the integrator output shadow and a reset of the integrator, i.e. the current integrator value is reset to 0.

Thus, the integrator 104 integrates over a predetermined number of decimation samples. Then, upon triggering by the integration counter 105, the integration value obtained by integration over the predetermined number of decimation samples is transferred to the integrator output shadow 106, the integrator 104 is reset and the integration starts anew.

In the following, a typical situation will be illustrated wherein required values have to be calculated. In this example, a new value is respectively required after time intervals which are shorter than the time intervals that lie between two SD-ADC values generated subsequently. Thus, the required values are not obtained directly, but continuous calculation of these "in-between" or intermediate values is performed.

Figure 2:
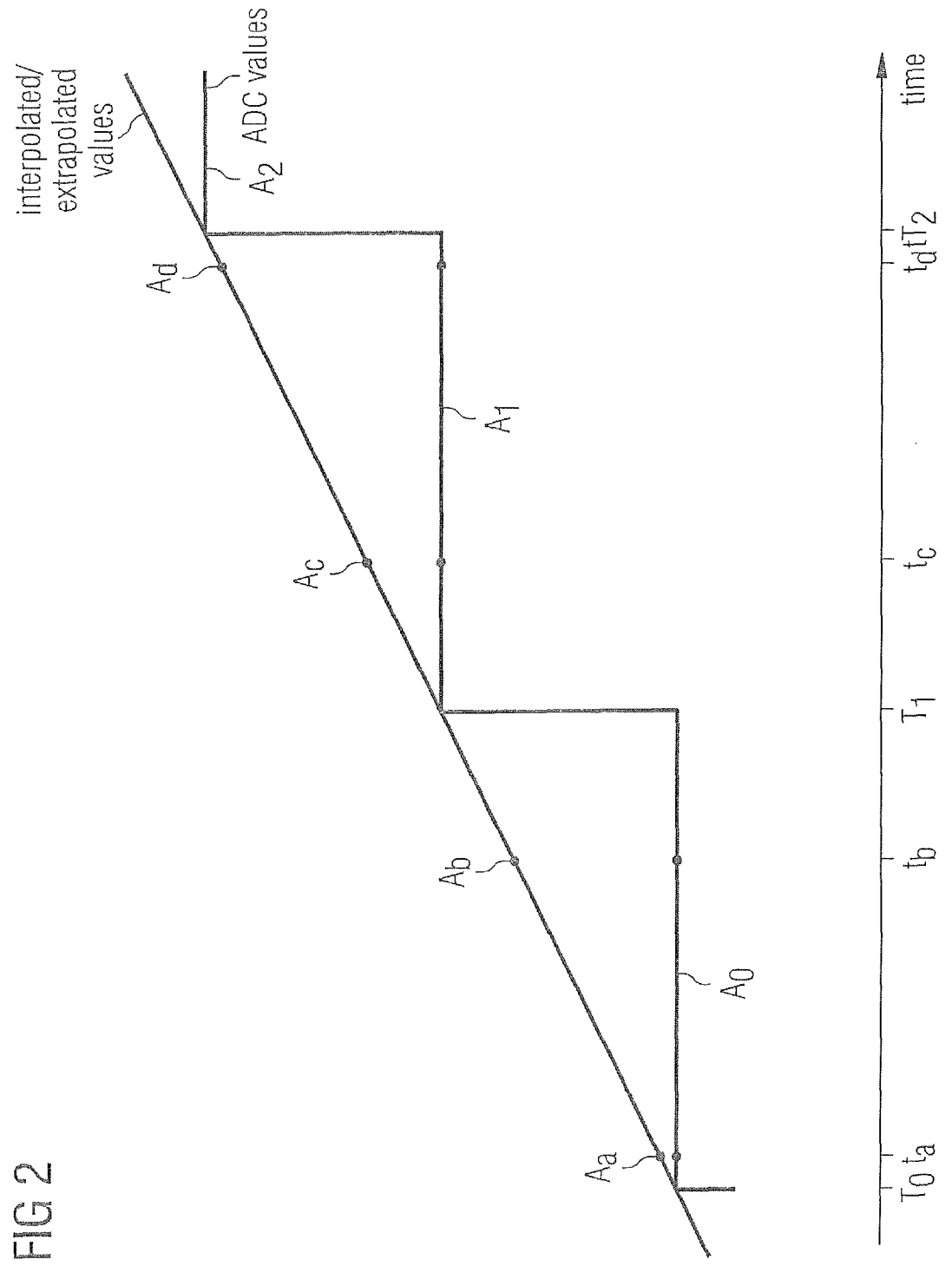
FIG. 2 shows a schematic diagram illustrating the calculation of the intermediate values.

FIG. 2 shows a schematic diagram illustrating the calculation of the intermediate values. An exemplary development of values generated by the SD-ADC over time may be represented by a step or staircase function as the SD-ADC values are generated at certain point of times ($T_0$, $T_1$, $T_2$, ...) separated by constant time intervals $\Delta T$ during which respective SD-ADC values ($A_0$, $A_1$, $A_2$, ...) do not change. Measuring values are, however, required at certain time points, e.g. $t_a$, $t_b$, $t_c$, $t_d$ ..., which are separated by time intervals $\Delta t$, wherein $\Delta t < \Delta T$. As can be seen from the diagram, the step function does not show the correct values of the quantity to be measured at the time points $t_a$, $t_b$, $t_c$ and $t_d$.

The development of the quantity to be measured may be considered as linear function including the points ($T_0/A_0$, $T_1/A_1$ and $T_2/A_2$). This linear approximation is appropriate as the time intervals $T_1-T_0=T_2-T_1=\Delta T$ are sufficiently small. Therefore, the correct values of the quantity to be measured at the time points $t_a$, $t_b$, $t_c$ and $t_d$ can be obtained by the following equation for the extrapolation between the points ($T_0/A_0$) and ($T_1/A_1$):

$$A_c = A_1 + (t_c - T_1)^*(A_1 - A_0)/(T_2 - T_1) \quad (1a)$$

or $$A_c = A_1 + (t_c - T_1)^*(A_1 - A_0)/(T_1 - T_0) \quad (1b)$$

wherein:

$A_0$ represents the SD-ADC value generated at the time $T_0$;
$A_1$ represents the SD-ADC value generated at the time $T_1$;
$A_c$ represents the extrapolated value at the time $t_c$;
($T_2-T_2$)=($T_1-T_0$) represents the constant time interval lying between the generation of two subsequent SD-ADC values; and
($t_c-T_1$) represents the "age" of the SD-ADC value (generated at the time $T_1$) at the time $t_c$.

Figure 3:
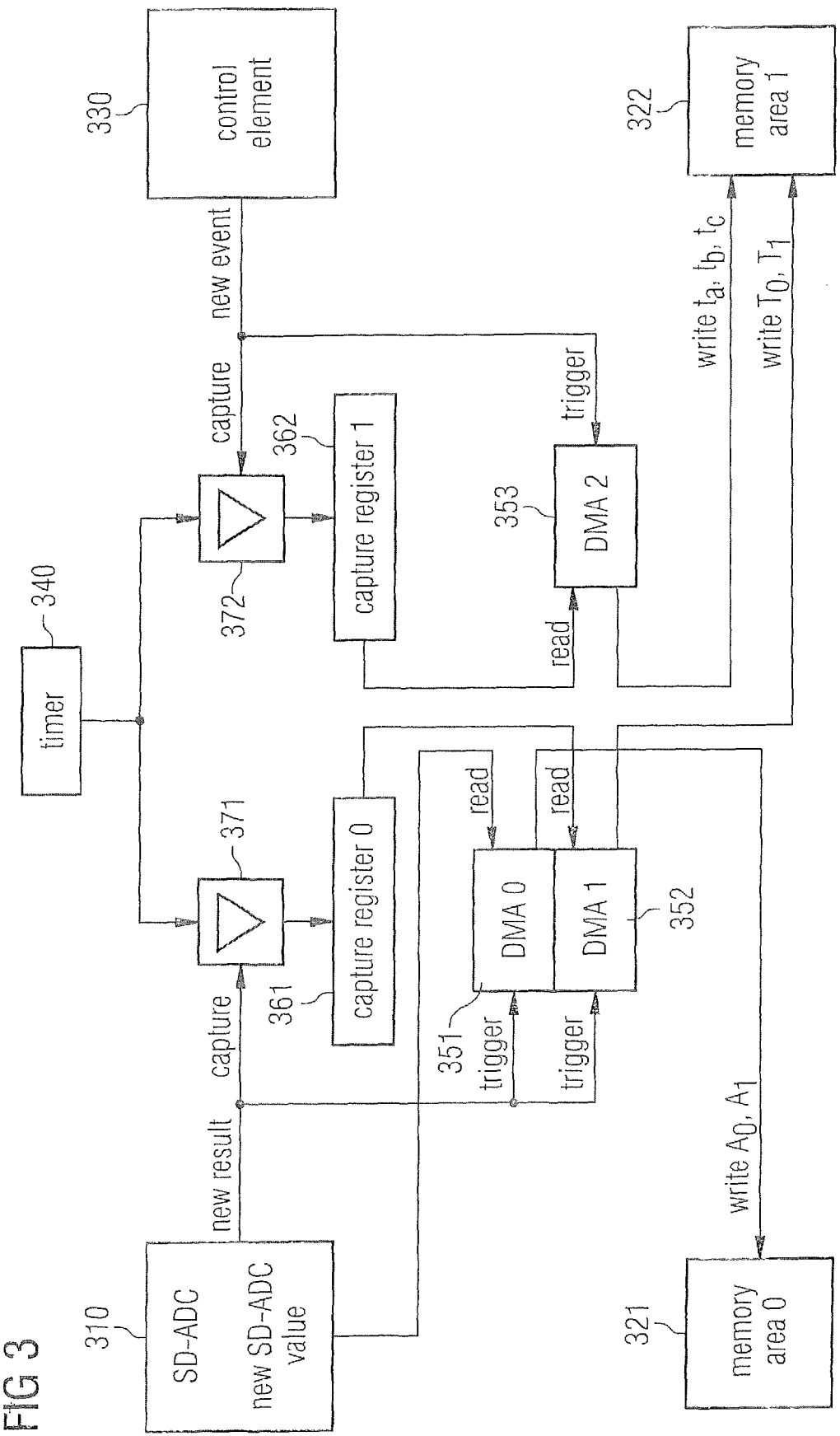
FIG. 3 shows a simplified schematic diagram of a possible design of an exemplary system for capturing and storing SD-ADC values and timer values.

FIG. 3 shows a simplified schematic diagram of a possible design of an exemplary system for capturing and storing SD-ADC values and timer values required for the extrapolation (or interpolation) described above, i.e. the SD-ADC values together with their respective times of generation and the times of events at which data is required.

The exemplary system shown in FIG. 3 comprises an SD-ADC 310, a first memory area 321 for storing SD-ADC values, a second memory area 322 for storing timer values, a control element 330 indicating each new event at which data is required, a timer 340 provided with a first capture function element 371 and a second capture function element 372, a first DMA channel 351, a second DMA channel 352, a third DMA channel 353, a first capture register 361 for holding a first current (last captured) timer value and a second capture register 362 for holding a second current (last captured) timer value.

The timer 340 provides both the times at which respective SD-ADC values are generated ("generation times") and the times of events at which data is required ("event times"). For this, the timer 340 comprises a first capture function for capturing the generation times of respective SD-ADC values and a second capture function for capturing the event times.

When the SD-ADC 310 generates a new SD-ADC value/result and indicates the generation of the new SD-ADC value/result by outputting a first trigger signal ("new result"), the first capture function element 371 is triggered by the first trigger signal to capture the current timer value (e.g. $T_0$ or $T_1$) and transfer it to the first capture register 361 for buffering. Then, the second DMA channel 352 reads out the buffered timer value from the first capture register 361 and transfers it to the second memory area 322 for storing.

The first trigger signal also triggers the first DMA channel 351 to read out the newly generated SD-ADC value (e.g. $A_0$ or $A_1$) from the SD-ADC 310 and transfer it to the first memory area 321 for storing. It is pointed out that the SD-ADC values and their respective generation times are stored such that the SD-ADC value is unambiguously related to its corresponding generation time.

When the control element 330 indicates a new event by outputting a second trigger signal ("new event"), the second capture function element 372 is triggered by the second trigger signal to capture the current timer value (e.g. $t_a$, $t_b$ or $t_c$) and transfer it to the second capture register 362 for buffering. Then, the third DMA channel 353, which also receives the second trigger signal, reads out the buffered timer value from the second capture register 362 and transfers it to the second memory area 322 for storing.

Figure 4:
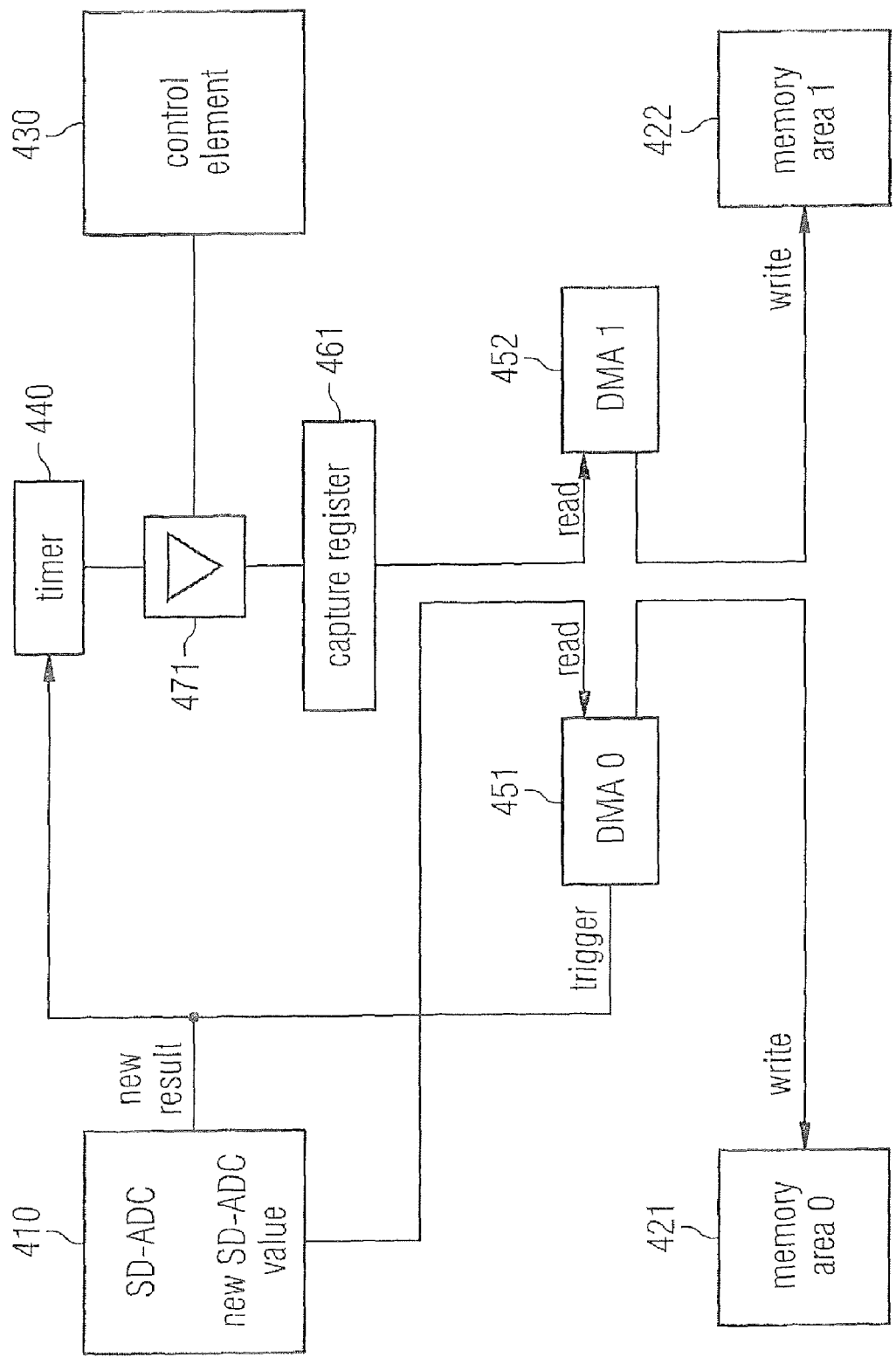
FIG. 4 exemplarily shows a simplified schematic diagram of a system according to an embodiment of the invention.

FIG. 4 exemplarily shows a simplified schematic diagram of a system according to an embodiment of the invention. The system of FIG. 4 is a refinement of the system of FIG. 3 as it requires less chip area and is still capable of capturing and storing SD-ADC values and timer values required for the extrapolation (or interpolation) described above. In particular, the system of FIG. 4 reduces the number of required DMA channels as only two DMA channels are utilized.

The exemplary system shown in FIG. 4 comprises an SD-ADC 410, a first memory area 421 for storing SD-ADC values, a second memory area 422 for storing timer values, a control element 430 indicating each new event at which data is required, a timer 440 provided with a capture function element 471, a first DMA channel 451, a second DMA channel 452, and a capture register 461 for holding a current (last captured) timer value.

When the SD-ADC 410 generates a new SD-ADC value/result, it indicates the generation of the new SD-ADC value/result by outputting a first trigger signal ("new result") to the first DMA channel 451 and the timer 440. On the one hand, the first trigger signal triggers the first DMA channel 451 to read out the newly generated SD-ADC value (e.g. $A_0$ or $A_1$) from the SD-ADC 410 and transfer it to the first memory area 421 for storing. On the other hand, the first trigger signal causes the timer 440 to be cleared, i.e. upon receiving the first trigger signal, the timer is reset to 0.

When the control element 430 indicates a new event by outputting a second trigger signal ("new event"), the capture function element 471 is triggered by the second trigger signal to capture the current timer value and transfer it to the capture register 461 for buffering. Then, the second DMA channel 452, which also receives the second trigger signal, reads out the buffered timer value from the capture register 461 and transfers it to the second memory area 422 for storing.

In the system of FIG. 4, the timer 440 is reset to 0 each time the SD-ADC 410 outputs a new result. Thus, the timer values comprise not absolute, but relative time specifications which specify the time elapsed since the ADC-SD 410 has output its lastly computed value/result. Thus, the timer values Δt stored in the second memory area 422 respectively indicate the "age" of the lastly computed SD-ADC value at the time of a certain event indicated by the control element 430. All values output by the SD-ADC 410 are stored in chronological order (i.e. in the order/reverse order of their generation) in the first memory area 421. In other words, the SD-ADC values are stored serially, wherein a just generated value is added to the series of SD-ADC values already stored in the first memory area 421. Advantageously, the first memory area 421 and second memory area 422 comprise circular buffers which have a suitable number of elements to allow storage of the required values for a time period long enough for computing the intermediate measuring values.

When an event occurs, i.e. a measuring value is required, the calculation of this value should be performed in a preferably short period in order to allow the just stored timer value $\Delta t_m$ to be related to its corresponding SD-ADC value $A_n$ (whose "age" at the time of the event is stored as timer value $\Delta t_m$). With that, the required value can be calculated by means of the following equation which is based on the equation (1a) and (1b), respectively:

$$A_c = A_n + \Delta t_m * (A_n - A_{n-1})/\Delta T$$

or $$A_c = A_n + \Delta t_m / \Delta T * (A_n - A_{n-1}) \quad (2)$$

wherein:

$A_n$ represents the SD-ADC value generated lastly (at the time $t_c$ of the event) wherein the index n is a positive integer;
$A_{n-1}$ represents the SD-ADC value generated previously to $A_n$;
$A_c$ represents the extrapolated value at the time $t_c$;
$\Delta T$ represents the constant time interval lying between the generation of two subsequent SD-ADC values (which is known for the respective SD-ADC converter); and
$\Delta t_m$ represents the "age" of the current (lastly generated) SD-ADC value $A_n$ at the time $t_c$, wherein the index m is a positive integer.

Figure 5:
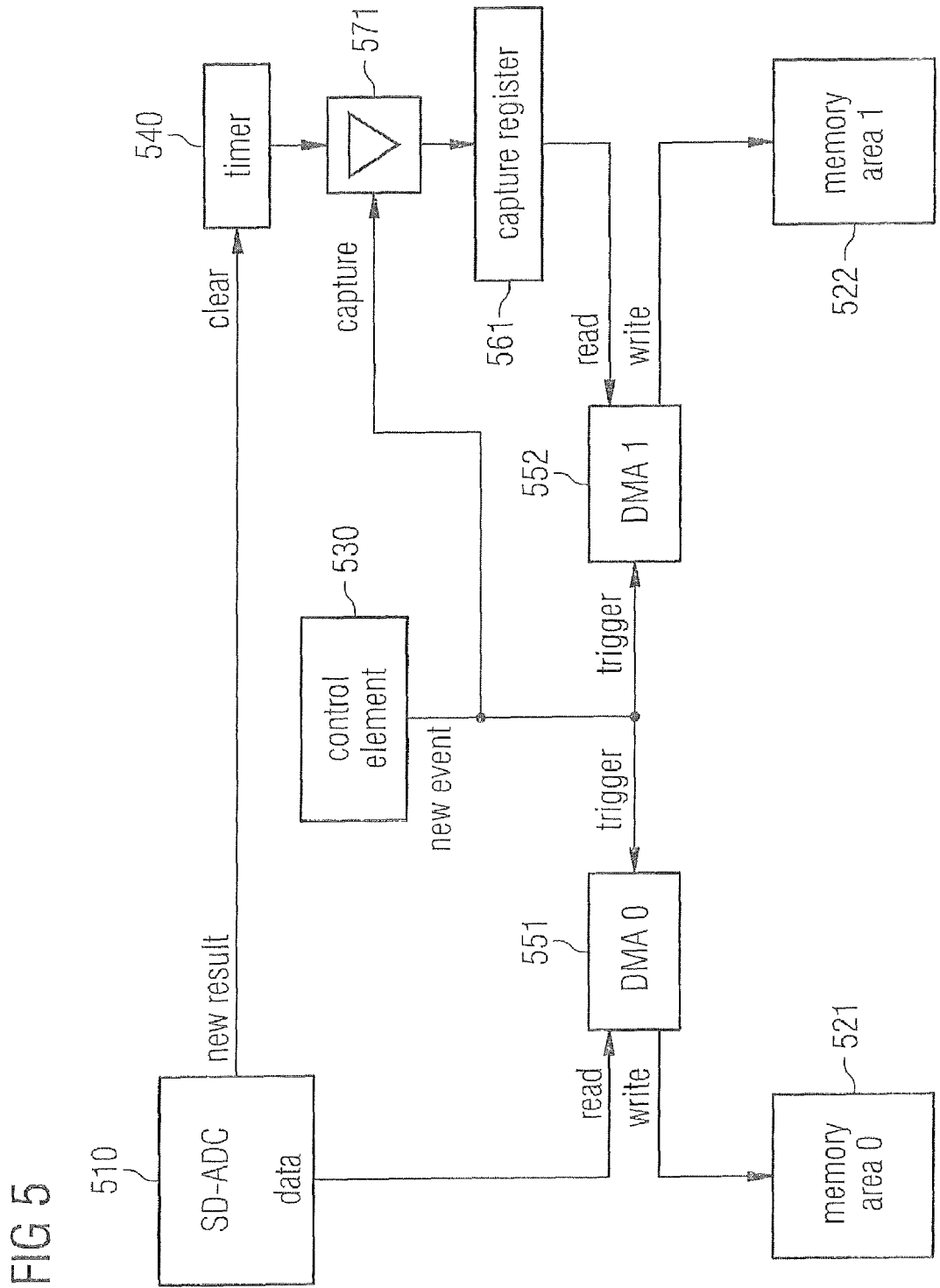
FIG. 5 exemplarily shows a simplified schematic diagram of a system according to a further embodiment of the invention.

FIG. 5 exemplarily shows a simplified schematic diagram of a system according to an embodiment of the invention. The system of FIG. 5 is also a refinement of the system of FIG. 3 as it requires less chip area and is still capable of capturing and storing SD-ADC values and timer values required for the extrapolation (or interpolation) described above. In particular, as only two DMA channels are utilized, the system of FIG. 5 reduces the number of required DMA channels.

The exemplary system shown in FIG. 5 comprises an SD-ADC 510, a first memory area 521 for storing SD-ADC values, a second memory area 522 for storing timer values, a control element 530 indicating each new event at which data is required, a timer 540 provided with a capture function element 571, a first DMA channel 551, a second DMA channel 552, and a capture register 561 for holding a current (last captured) timer value.

Each time the SD-ADC 510 generates a new SD-ADC value/result, it indicates the generation of the new SD-ADC value/result by outputting a first trigger signal ("new result") to the timer 540 which causes the timer 440 to be cleared. Thus, upon receiving the first trigger signal from the SD-ADC 510, the timer is reset to 0.

When the control element 530 indicates a new event, it outputs a second trigger signal ("new event") which is received by the first DMA channel 551, the second DMA channel 552 and the capture function element 571.

Upon receiving the second trigger signal, the first DMA channel 551 is triggered to read out the current (lastly generated) SD-ADC value/result (e.g. $A_0$ or $A_1$) from the SD-ADC 510 and transfer it to the first memory area 521 for storing.

Upon receiving the second trigger signal, the capture function element 571 is triggered to capture the current timer value and transfer it to the capture register 561 for buffering. Then, the second DMA channel 552, which also receives the second trigger signal, reads out the buffered timer value from the capture register 561 and transfers it to the second memory area 522 for storing.

In the system of FIG. 5, the time is reset to 0 each time the SD-ADC outputs a new result. Therefore, the timer values are not absolute, but relative time specifications which specify the time elapsed since the ADC-SD has output its lastly computed value/result. Thus, the timer values Δt stored in the second memory area 522 respectively indicate the "age" of the lastly computed SD-ADC value at the time of a certain event indicated by the control element 530.

When an event occurs, not only the current timer value is stored in the second memory area 522, but also the current (i.e. lastly computed) SD-ADC value is stored in the first memory area 521.

As both the timer values and the SD-ADC values are serially stored in chronological order, a timer value $\Delta t_m$ can be related to its corresponding SD-ADC value $A_n$ (whose "age" at the time of the event is stored as timer value $\Delta t_m$) in a simple manner: Those timer and SD-ADC values $\Delta t_m$ and $A_n$ are brought together which relate to corresponding positions in the series of SD-ADC and timer values stored chronologically in the first and second memory area, respectively. For example, the timer value stored at "position 3" in the second memory area 522 is related to the SD-ADC value stored at "position 3" in the first memory area 521. Or, expressed in a more general way, the timer value stored at "position p" in the second memory area 522 is related to the SD-ADC value stored at "position p" in the first memory area 521. Advantageously, the first memory area and second memory area comprise circular buffers which have a suitable number of elements to allow storage of the required values for a time period long enough for computing the intermediate measuring values.

With that, the measuring value required at a certain time/event can also be calculated by means of equation (2) which has already been introduced with reference to the system of FIG. 4:

$$A_c = A_n + \Delta t_m * (A_n - A_{n-1})/\Delta T$$

or $$A_c = A_n + \Delta t_m/\Delta T * (A_n - A_{n-1}) \qquad (2)$$

wherein:

$A_n$ represents the current (lastly generated) SD-ADC value (at the time $t_c$ of the event) wherein the index n is a positive integer;

$A_{n-1}$ represents the SD-ADC value generated previously to $A_n$;

$A_c$ represents the extrapolated value at the time $t_c$;

$\Delta T$ represents the constant time interval lying between the generation of two subsequent SD-ADC values (which is known for the respective SD-ADC converter); and $\Delta t_m$ represents the "age" of the current (lastly generated) SD-ADC value $A_n$ at the time $t_c$, wherein the index m is a positive integer.

In this embodiment of the invention, a minor difficulty may arise when trying to specify the value $A_{n-1}$ which represents the SD-ADC value generated previously to $A_n$ as the events at which a new measuring value is required may occur with higher frequency than the generation of values by the SD-ADC. Thus, the SD-ADC value stored previously in the first memory area may not be the value generated previously by the SD-ADC, but the same SD-ADC value.

However, this minor problem can be solved by examining the corresponding stored timer values: A stored timer value will be smaller than its antecessor only if the timer has been reset to 0 between the capture of these two timer values. Further, the timer is reset to 0 if and only if the SD-ADC outputs a new value/result. Hence, the stored timer values may be examined in order to specify the SD-ADC value generated previously: A preceding timer value which is smaller than the timer value $\Delta t_m$ used in equation (2) refers to the same SD-ADC value as the timer value $\Delta t_m$ does. Accordingly, the timer values $\Delta t_m$ may be examined when being received: If the currently received timer value $\Delta t_m$ is smaller than the previously received timer value, the currently received timer value $\Delta t_m$ refers to a new value/result output by the SD-ADC.

Equation (2) describes the calculation of a required value by extrapolation. Naturally, the calculation of a required value may be done by interpolation using equation (3):

$$A_c = A_n + \Delta t_m * (A_{n+1} - A_n)/\Delta T$$

or $$A_c = A_n + \Delta t_m/\Delta T * (A_{n+1} - A_n) \qquad (3)$$

wherein:

$A_n$ represents the current (lastly generated) SD-ADC value (at the time $t_c$ of the event) wherein the index n is a positive integer;

$A_{n+1}$ represents the SD-ADC value generated consecutively to $A_n$;

$A_c$ represents the interpolated value at the time $t_c$;

$\Delta T$ represents the constant time interval lying between the generation of two subsequent SD-ADC values (which is known for the respective SD-ADC converter); and $\Delta t_m$ represents the "age" of the current (lastly generated) SD-ADC value $A_n$ at the time $t_c$, wherein the index m is a positive integer.

In this case, the SD-ADC value, to which the "first" subsequent timer value which is smaller than the timer value $\Delta t_m$ refers, is the SD-ADC value $A_{n+1}$ generated consecutively to the SD-ADC value A.

Figure 6:
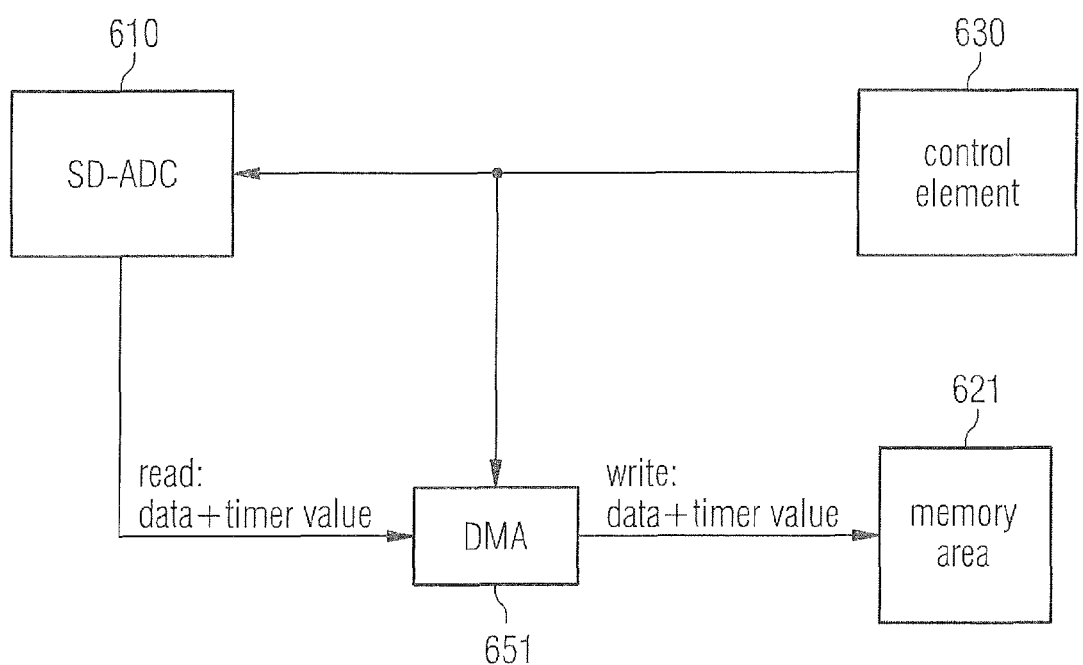
FIG. 6 exemplarily shows a simplified schematic diagram of a system according to a further embodiment of the invention.

FIG. 6 exemplarily shows a simplified schematic diagram of a system according to a further embodiment of the invention. The system shown in FIG. 6 requires even less chip are than the systems according to FIGS. 4 and 5 and is still capable of capturing and storing SD-ADC values and timer values required for the extrapolation (or interpolation) described above. In particular, the system of FIG. 6 further reduces the number of required DMA channels as only one DMA channel is utilized.

The exemplary system shown in FIG. 6 comprises an SD-ADC 610, a memory area 621, a control element 630 indicating each new event at which data is required, and a DMA channel 651.

Figure 7:
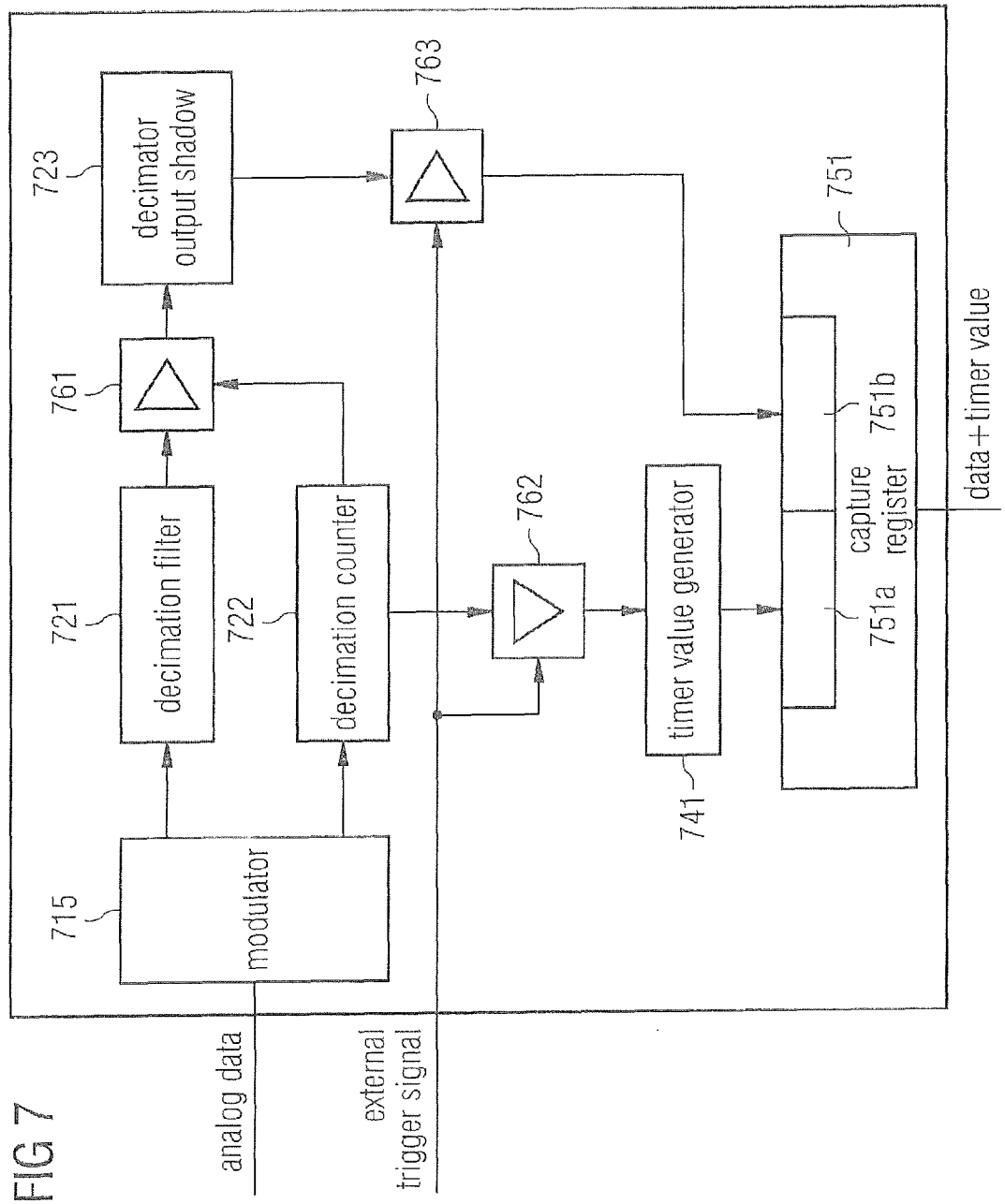
FIG. 7 shows a first embodiment of an SD-ADC which may be used in the exemplary system of FIG. 6.
Figure 8:
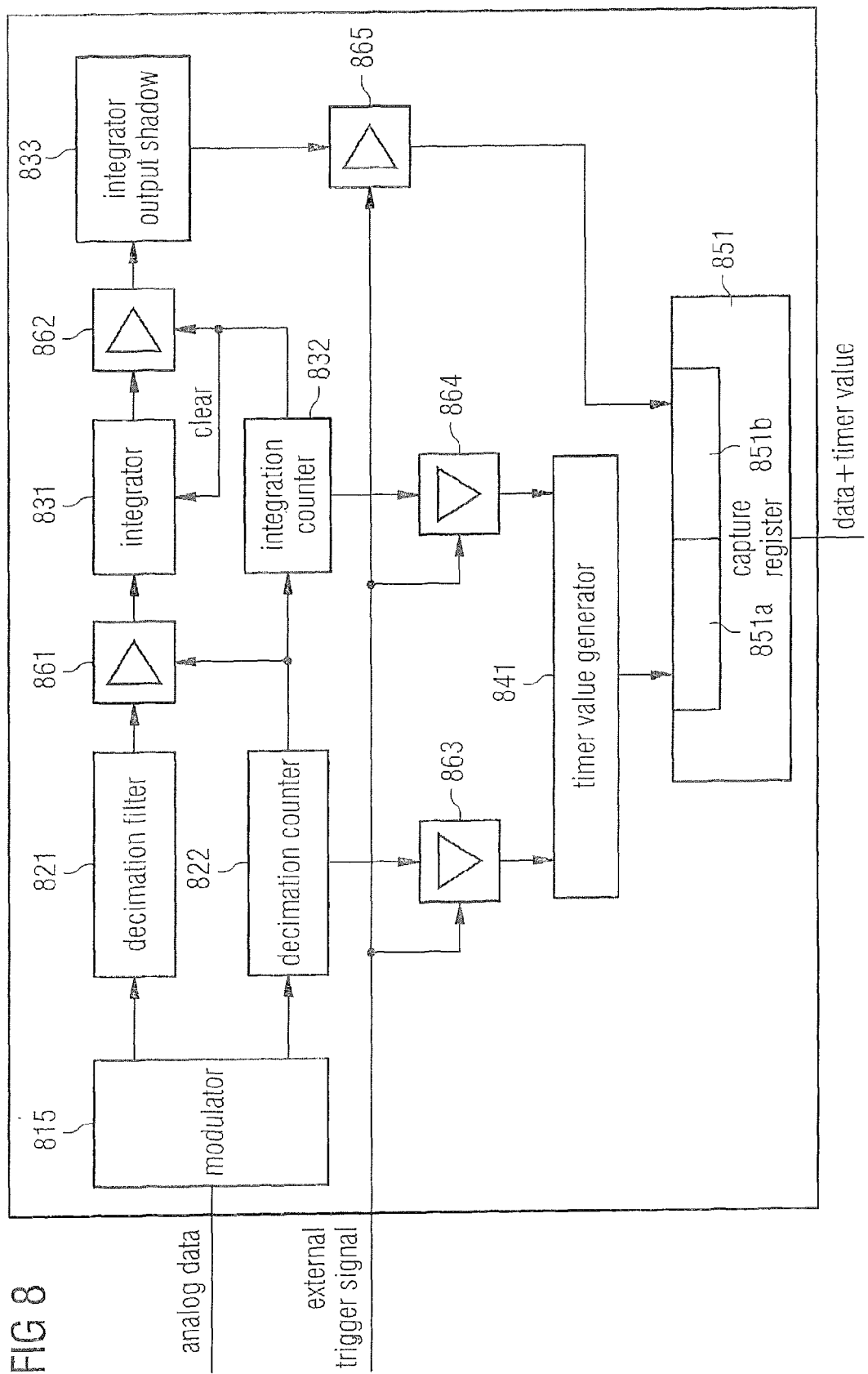
FIG. 8 shows a second embodiment of an SD-ADC which may be used in the exemplary system of FIG. 6.

In the system of FIG. 6, the SD-ADC 610 respectively provides both the current (lastly generated) SD-ADC value $A_n$ and its corresponding "age" $\Delta t_m$ at the time of the event. In FIGS. 7 and 8, exemplary embodiments of an SD-ADC which may be used in the exemplary system shown in FIG. 6 are shown and will be described below.

Now referring back to FIG. 6, the control element 630 indicates each new event by outputting a trigger signal ("new event") which is received by the SD-ADC 610 and the DMA channel 651.

Upon receiving the trigger signal, the SD-ADC 610 is triggered to provide the current (lastly generated) SD-ADC value/result $A_n$ and its corresponding "age" $\Delta t_m$ at the time of the event.

Upon receiving the trigger signal, the DMA channel 651 is triggered to read out the current (lastly generated) SD-ADC value/result $A_n$ together with its corresponding "age" $\Delta t_m$ from the SD-ADC 610 and transfer it to the memory area 621 for storing. Advantageously, the memory area 621 comprises a circular buffer which has a suitable number of elements to allow storage of the required values for a time period long enough for computing the intermediate measuring values.

With that, the measuring value required at a certain time/event can again be calculated by means of equation (2):

$$A_c = A_n + \Delta t_m * (A_n - A_{n-1})/\Delta T$$

or $$A_c = A_n + \Delta t_m/\Delta T * (A_n - A_{n-1}) \quad (2)$$

wherein:

$A_n$ represents the current (lastly generated) SD-ADC value (at the time $t_c$ of the event) wherein the index n is a positive integer;

$A_{n-1}$ represents the SD-ADC value generated previously to $A_n$;

$A_c$ represents the extrapolated value at the time $t_c$;

$\Delta T$ represents the constant time interval lying between the generation of two subsequent SD-ADC values (which is known for the respective SD-ADC converter); and $\Delta t_m$ represents the "age" of the current (lastly generated) SD-ADC value $A_n$ at the time $t_c$, wherein the index m is a positive integer.

Also in this embodiment of the invention, a minor difficulty may arise when trying to specify the value $A_{n-1}$ which represents the SD-ADC value generated previously to $A_n$ as the events, at which a new measuring value is required, may occur with higher frequency than the generation of values by the SD-ADC. Thus, the SD-ADC value stored previously in the first memory area may not be the value generated previously by the SD-ADC, but the same SD-ADC value.

As shown before with reference to the exemplary system of FIG. 5, this minor problem can be easily solved by examining the corresponding stored timer values: A stored timer value will be smaller than its antecessor only if the "internal timer" of the SD-ADC has been reset to 0 between the generation of these two timer values. Further, the "internal timer" is reset to 0 if and only if the SD-ADC has just generated a new value/result. Hence, the stored timer values may be examined in order to specify the SD-ADC value generated previously: A preceding timer value which is smaller than the timer value $\Delta t_m$ used in equation (2) refers to the same SD-ADC value as the timer value $\Delta t_m$ does. Accordingly, the timer values $\Delta t_m$ may be examined when being received: If the currently received timer value $\Delta t_m$ is smaller than the previously received timer value, the currently received timer value $\Delta t_m$ refers to a new value/result output by the SD-ADC.

As already mentioned above, equation (2) describes the calculation of a required value by extrapolation. Naturally, the calculation of a required value may also be done by interpolation using equation (3):

$$A_c = A_n + \Delta t_m * (A_{n+1} - A_n)/\Delta T$$

or $$A_c = A_n + \Delta t_m/\Delta T * (A_{n-1} - A_n) \quad (3)$$

wherein:

$A_n$ represents the current (lastly generated) SD-ADC value (at the time $t_c$ of the event) wherein the index n is a positive integer;

$A_{n+1}$ represents the SD-ADC value generated consecutively to $A_n$;

$A_c$ represents the interpolated value at the time $t_c$;

$\Delta T$ represents the constant time interval lying between the generation of two subsequent SD-ADC values (which is known for the respective SD-ADC converter); and $\Delta t_m$ represents the "age" of the current (lastly generated) SD-ADC value $A_n$ at the time $t_c$, wherein the index m is a positive integer.

In this case, the SD-ADC value, to which the "first" subsequent timer value which is smaller than the timer value $\Delta t_m$ belongs, is the SD-ADC value $A_{n+1}$ generated consecutively to the SD-ADC value $A_n$.

FIG. 7 shows a first embodiment of an SD-ADC which may be used in the exemplary system of FIG. 6. The illustrated exemplary SD-ADC comprises a modulator 715, a decimation filter 721 provided with a first capture element 761, a decimation counter 722 provided with a second capture element 762, a decimator output shadow 723 provided with a third capture element 763, a timer value generator (time stamp generator) 741, a capture register 751 having a first section 751a for holding a current (lastly captured) timer value and a second section 751b for holding a current (lastly captured) SD-ADC value.

The modulator 715 has its outputs connected to the input of the decimation filter 721 and the input of the decimation counter 722. The output of the decimation counter 722 is connected to an input of the first capture function element 761. The output of the decimation filter 721 is connected to an input of the decimator output shadow 723 via the first capture function element 761 which is triggered by the output of the decimation counter 722. The output of the decimator output shadow 723 is connected to the second section 751b of the capture register 751 via the third capture function element 763 which is triggered by an external trigger signal (e.g. "new event") received at an input of the SD-ADC 710. An output of the decimation counter 722 is connected to an input of the timer value generator 741 via the second capture function element 762 which is also triggered by the external trigger signal. An output of the timer value generator 741 is connected to the first section 751a of the capture register 751.

The decimation filter 721 continuously receives samples (i.e. data) from the modulator 715 and generates a decimated sample based on a predetermined number of received samples wherein the number is defined by the oversampling rate of the SD-ADC 710. For this, the decimation filter 721 is triggered by the output of the decimation counter 722.

The decimation counter 722 receives a clock frequency of the modulator 715, $f_{MOD}$, and, based on an oversampling rate OSR, triggers the output of a decimated sample. In other words, the decimation counter 722 "counts" the samples received by the decimation filter 721 from the modulator 715 and triggers the output of a decimated sample when a predetermined number of samples has been received by the decimation filter 721.

The decimated sample is transferred to the decimator output shadow which holds the received value until it receives a "new" decimated sample. The third capture function element 763 reads out the value from the decimator output shadow 723, when triggered by the external trigger signal received at an input of the SD-ADC 710, and writes the read out value into the second section 751a of the capture register 751.

The second capture function element 762 reads out the current counter value from the decimation counter 722, when triggered by the external trigger signal and transfers the read out decimation counter value to the timer value generator 741.

The timer value generator (time stamp generator) 741 may optionally be provided to generate a timer value (time stamp) based on the received decimation counter value and the decimation rate of the decimator. In other words, the timer value generator performs a format conversion to obtain the timer value. Then, the timer value generator transfers the timer value, which is the "age" of the current (lastly generated) SD-ADC value at the time of the event, to the first section 751a of the capture register 751.

For example, the timer value $\Delta t_m$ may be calculated using the following equation:

$$\Delta t_m = \Delta T * dc/dr \quad (4)$$

wherein:

$\Delta T$ represents the constant time interval lying between the generation of two subsequent SD-ADC values (which is known for the respective SD-ADC converter);

dc represents the received decimation counter value;

dr represents the decimation rate, which is the number of samples which are used by the decimator to generate a decimated sample.

When calculating the timer value $\Delta t_m$ with the help of the above equation, the division by the value "dr" is generally carried out by the use of software.

FIG. 8 shows a second embodiment of an SD-ADC which may be used in the exemplary system of FIG. 6. The illustrated exemplary SD-ADC comprises a modulator 815, a decimation filter 821 provided with a first capture element 861, a decimation counter 822 provided with a third capture element 863, an integrator 831 provided with a second capture element 862, an integration counter 832 provided with a fourth capture element 864, an integrator output shadow 833 provided with a fifth capture element 865, a timer value generator (time stamp generator) 841, a capture register 851 comprising a first section 851a for holding a current (lastly captured) timer value and a second section 851b for holding a current (lastly captured) SD-ADC value.

The modulator 815 has its outputs connected to the input of the decimation filter 821 and the input of the decimation counter 822. The decimation counter 822 has a first output connected to an input of the first capture function element 861 and the input of the integration counter 832, and a second output connected to an input of the third capture function element 863. The output of the decimation filter 821 is connected to an input of the integrator 862 via the first capture function element 861 which is triggered by the first output of the decimation counter 822.

The integration counter 832 has a first output connected to an input of the integrator 831 and an input of the second capture function element 862, and a second output connected to an input of the fourth capture function element 864. The output of the integrator 831 is connected to the integrator output shadow 833 via the second capture function element 862 which is triggered by the first output of the integration counter 832. The output of the integrator output shadow 833 is connected to the second section 851b of the capture register 851 via the fifth capture function element 865 which is triggered by an external trigger signal received at an input of the SD-ADC 810.

The second output of the decimation counter 822 is connected to a first input of the timer value generator 841 via the third capture function element 863 which is also triggered by the external trigger signal. An output of the integration counter 832 is connected to a second input of the timer value generator 841 via the fourth capture function element 864 which is also triggered by the external trigger signal. The timer value generator 841 has its output connected to the first section 851a of the capture register 851.

The decimation filter 821 continuously receives samples (i.e. data) from the modulator 815 and generates a decimated sample based on a predetermined number of received samples wherein the number is defined by the oversampling rate of the SD-ADC. For this, the capture function of the decimation filter 821 is triggered by the first output of the decimation counter 822.

The decimation counter 822 receives a clock frequency of the modulator 815, $f_{MOD}$, and, based on an oversampling rate OSR, triggers the output of a decimated sample. In other words, the decimation counter 822 "counts" the samples received by the decimation filter 821 from the modulator 815 and triggers the output of a decimated sample when a predetermined number of samples has been received by the decimation filter 821.

The integrator 831 receives the decimated samples from the decimation filter 821 and integrates over the received decimated samples.

The integration counter 832 also receives the trigger signal output by the decimation counter 822. When the integration counter 832 has received a predetermined number of trigger signals from the decimation counter 822, the integration counter 832 outputs a further trigger signal which causes a transfer of the current integration value to the integrator output shadow 833 and a reset of the integrator 831, i.e. the current integrator value is reset to 0.

Thus, the integrator 831 integrates over a predetermined number of decimation samples. Then, upon triggering by the integration counter 832, the integration value obtained by integration over the predetermined number of decimation samples is transferred to the integrator output shadow 833 which holds the received value until it receives a "new" integration result over a predefined number of decimated samples and the integrator 831 is reset whereupon the integration starts anew.

When an external trigger signal ("new event") is received at the SD-ADC converter 810, for example from the control element 630 comprised in the system shown in FIG. 6, the third, fourth and fifth capture function elements 863, 864 and 865 are triggered to capture the respective signals applied to their inputs.

The third capture function element 863 reads out the current counter value from the decimation counter 822, when triggered by the external trigger signal, and transfers the read out decimation counter value to the timer value generator 841.

The fourth capture function element 864 reads out the current counter value from the integration counter 832, when triggered by the external trigger signal, and transfers the read out integration counter value to the timer value generator 841.

The fifth capture function element 865 reads out the value from the integrator output shadow 833, when triggered by the external trigger signal, and writes the read out value into the second section 851b of the capture register 851.

The timer value generator (time stamp generator) 841 generates a timer value (time stamp) based on:

the received decimation counter value,
the decimation rate of the decimator,
the received integration counter value; and
the number of decimation samples over which the integrator integrates to generate the SD-ADC value.

The timer value generator 841 then transfers the calculated timer value, which is the "age" of the current (lastly generated) SD-ADC value at the time of the event, to the first section 851a of the capture register 851.

For example, the timer value $\Delta t_m$ may be calculated using the following equation:

$$\Delta t_m = \Delta T_i * (dc/dr + ic)/ir \quad (5)$$

wherein:

$\Delta T_i$ represents the constant time interval lying between the generation of two subsequent output values of the integrator (which is known for the respective SD-ADC converter);

dc represents the received decimation counter value;

dr represents the decimation rate, which is the number of samples which are used by the decimator to generate a decimated sample;
ic represents the received integration counter value; and
ir represents the number of decimated samples over which the integrator integrates to generate the SD-ADC value.

The SD-ADCs shown in FIGS. 7 and 8 provide the SD-ADC values and the corresponding timer values such that a single DMA channel can be used to respectively read out an SD-ADC value together with its corresponding timer value.

It is, however, to be understood that the use of DMA channels in the exemplary embodiments of the invention described before is not mandatory, but other capturing means may also be used, wherein the capturing means may comprise one of the following elements or a combination thereof: a shadow register, a direct memory access channel, a software interrupt for initiating a software copy operation, and/or a capability of a central processing unit to poll for a certain event in order to start a copy operation.

Figure 9:
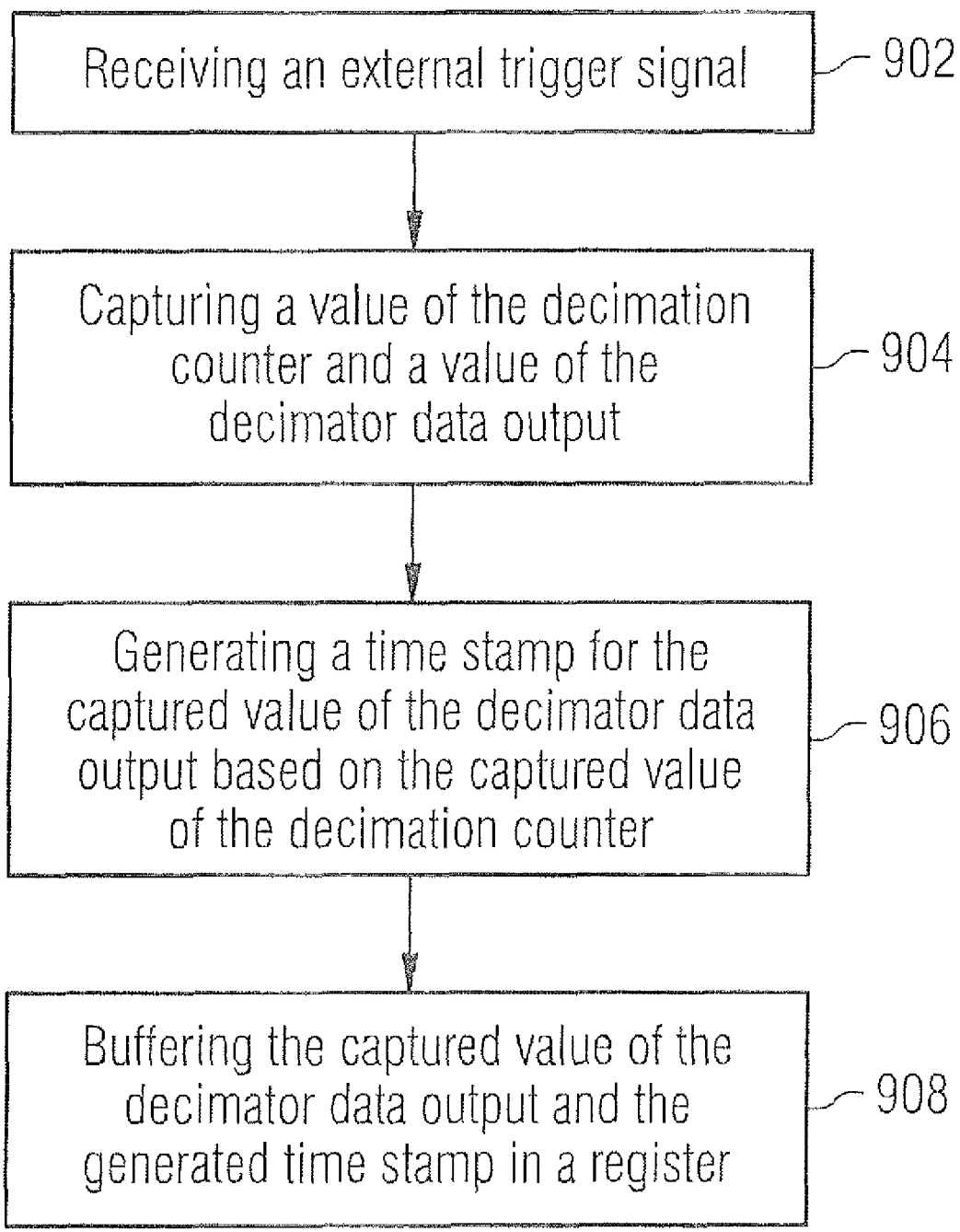
FIG. 9 shows a method according to a further embodiment of the invention.

FIG. 9 shows a method according to a further embodiment of the invention. The method is intended for use in a sigma-delta analog to digital converter comprising a modulator, a decimation filter, a decimation counter, and a decimator data output.

At 902, the method receives an external trigger signal.

At 904, the method captures a value of the decimation counter and a value of the decimator data output.

At 906, the method generates a time stamp for the captured value of the decimator data output based on the captured value of the decimation counter.

At 908, the method buffers the captured value of the decimator data output and the generated time stamp in a register.

Figure 10:
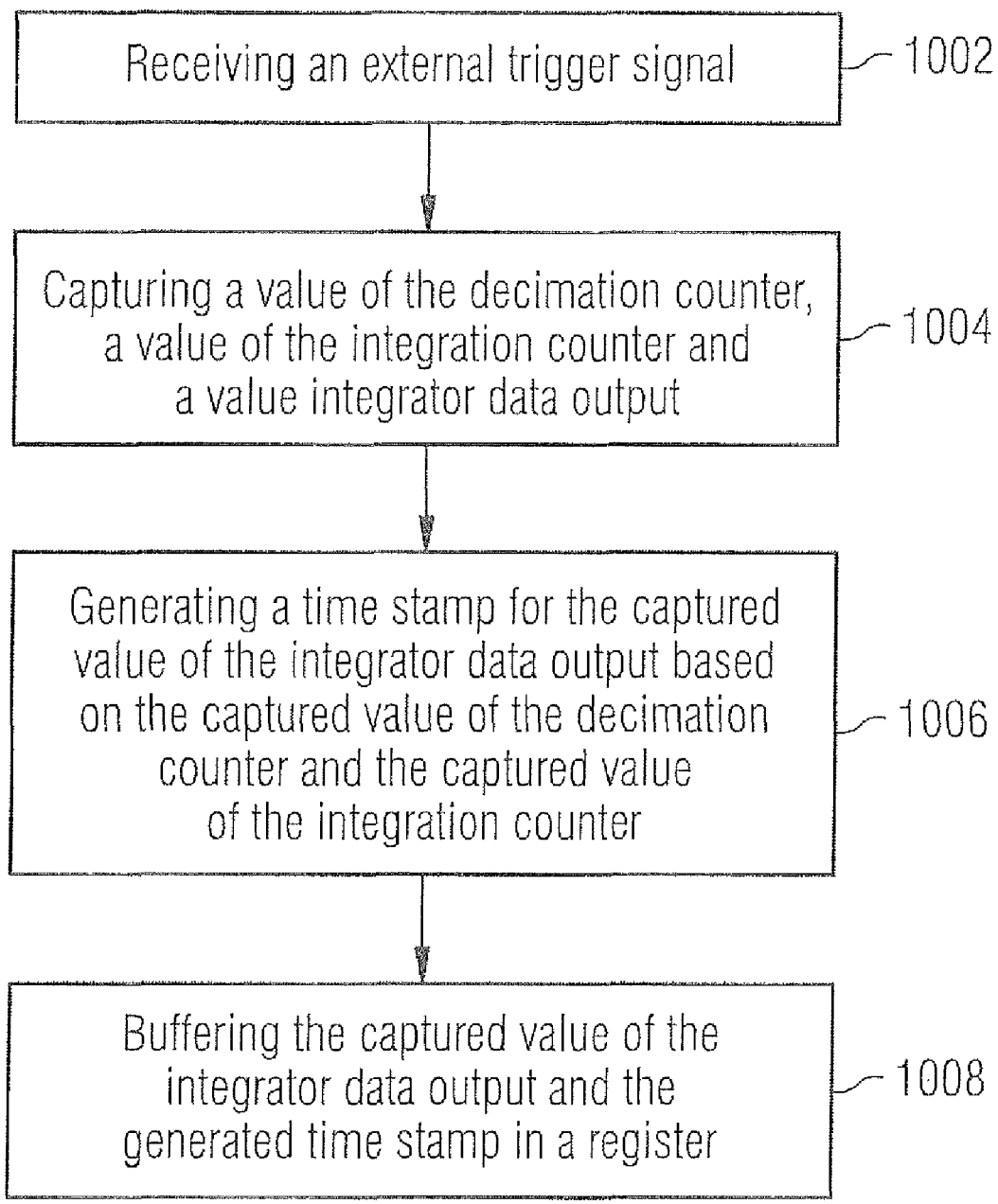
FIG. 10 shows a method according to a further embodiment of the invention.

FIG. 10 shows a method according to a further embodiment of the invention. The method is intended for use in a sigma-delta analog to digital converter comprising a modulator, a decimation filter, a decimation counter, an integrator, an integration counter, and an integrator data output.

At 1002, an external trigger signal is received.

At 1004, a value of the decimation counter, a value of the integration counter and a value of the integrator data output are captured.

At 1006, the method generates a time stamp for the captured value of the integrator data output based on the captured value of the decimation counter and the captured value of the integration counter.

At 1008, the method buffers the captured value of the integrator data output and the generated time stamp in a register.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
    a sigma-delta analog to digital converter (SD-ADC) configured to generate SD-ADC values;
    a timer;
    a capture function element;
    a capture register; and
    a control element configured to output a first trigger signal to the capture function element;
    wherein the capture function element is configured to capture a timer value of the timer when triggered by the first trigger signal and is further configured to transfer the captured timer value to the capture register;
    wherein the SD-ADC is configured to output a second trigger signal to the timer when generating a new SD-ADC value; and
    wherein the timer is set to a predefined value upon receiving the second trigger signal from the SD-ADC.

2. The system of claim 1, wherein the capture function element comprises one of the following elements or a combination thereof:
    a shadow register;
    a direct memory access channel;
    a module configured to generate a software interrupt for initiating a software copy operation; or
    a processing unit to poll for a certain event in order to start a copy operation.

3. The system of claim 1, wherein the system further comprises:
    another capture function element;
    wherein the SD-ADC is further configured to additionally output the second trigger signal to the another capture function element when generating a new SD-ADC value; and
    wherein the another capture function element is configured to capture the SD-ADC value from the SD-ADC upon receiving the second trigger signal from the SD-ADC.

4. The system of claim 3, wherein the another capture function element comprises one of the following elements or a combination thereof:
    a shadow register;
    a direct memory access channel;
    a module configured to generate a software interrupt for initiating a software copy operation; or
    a processing unit to poll for a certain event in order to start a copy operation.

5. The system of claim 3, wherein the capture function element and the another capture function element are operably coupled to a first circular buffer and a second circular buffer.

6. The system of claim 5, wherein the another capture function element is further configured to write SD-ADC values read out sequentially from the SD-ADC into adjacent elements of the first circular buffer, and the capture function element is configured to write timer values read out sequentially from the capture register into adjacent elements of the second circular buffer.

7. The system of claim 1, wherein the system further comprises:
    another capture function element,
    wherein the control element is configured to output the first trigger signal to the capture function element and the another capture function element, and
    wherein the another capture function element is configured to capture the SD-ADC value from the SD-ADC when triggered by the first trigger signal.

8. The system of claim 7, wherein the another capture function element comprises one of the following elements or a combination thereof:
    a shadow register;
    a direct memory access channel;
    a module configured to generate a software interrupt for initiating a software copy operation; or
    a processing unit to poll for a certain event in order to start a copy operation.

9. A sigma-delta analog to digital converter (SD-ADC) comprising:
 a modulator;
 a decimation filter;
 a decimation counter provided with a first capture function element; and
 a decimator data output provided with a second capture function element;
 wherein the first capture element is configured to capture a value of the decimation counter when triggered by an external trigger signal; and
 wherein the second capture element is configured to capture a value of the decimator data output when triggered by the external trigger signal.

10. The sigma-delta analog to digital converter of claim 9, further comprising:
 a time stamp generator, wherein the time stamp generator is configured to generate a time stamp for the captured value of the decimator data output based on the captured value of the decimation counter.

11. The sigma-delta analog to digital converter of claim 10, further comprising:
 a capture register configured to buffer the captured value of the decimator data output and the time stamp.

12. A method for use in a sigma-delta analog to digital converter (SD-ADC) comprising a modulator, a decimation filter, a decimation counter, and a decimator data output, the method comprising:
 receiving an external trigger signal; and
 capturing a value of the decimation counter and a value of the decimator data output upon receiving the external trigger signal.

13. The method of claim 12, further comprising:
 generating a time stamp for the captured value of the decimator data output based on the captured value of the decimation counter.

14. The method of claim 13, further comprising:
 buffering the captured value of the decimator data output and the generated time stamp in a register.

15. A sigma-delta analog to digital converter (SD-ADC) comprising:
 a modulator;
 a decimation filter;
 a decimation counter provided with a first capture function element;
 an integrator;
 an integration counter provided with a second capture function element; and
 an integrator data output provided with a third capture function element;
 wherein the first capture element is configured to capture a value of the decimation counter when triggered by an external trigger signal;
 wherein the second capture element is configured to capture a value of the integration counter when triggered by the external trigger signal; and
 wherein the third capture element is configured to capture a value of the integrator data output when triggered by the external trigger signal.

16. The sigma-delta analog to digital converter of claim 15, further comprising:
 a time stamp generator, wherein the time stamp generator is configured to generate a time stamp for the captured value of the integrator data output based on the captured value of the decimation counter and the captured value of the integration counter.

17. The sigma-delta analog to digital converter of claim 16, further comprising:
 a capture register configured to buffer the captured value of the integrator data output and the time stamp.

18. A system comprising:
 a sigma-delta analog to digital converter (SD-ADC) configured to periodically generate digital values based on incoming analog data signals;
 a control element;
 a capture function element; and
 a memory;
 wherein the control element is configured to output a trigger signal to the SD-ADC and the capture function element;
 wherein the SD-ADC is configured to buffer a lastly generated digital value and generate and buffer a time stamp referring to the lastly generated digital value upon receiving the trigger signal of the control element; and
 wherein the capture function element is configured to read out the buffered digital value and the corresponding time stamp upon receiving the trigger signal of the control element and write the read out digital value and time stamp into the memory.

19. The system of claim 18, wherein the capture function element comprises one of the following elements or a combination thereof:
 a shadow register;
 a direct memory access channel;
 a module configured to generate a software interrupt for initiating a software copy operation; or
 a processing unit to poll for a certain event in order to start a copy operation.

20. The system of claim 18, wherein the SD-ADC comprises:
 a decimation filter, and
 a decimation counter;
 wherein the SD-ADC is further configured to capture a value of the decimation counter upon receiving the trigger signal and generate the time stamp based on the captured decimation counter value.

21. The system of claim 18, wherein the SD-ADC comprises:
 a decimation filter;
 a decimation counter;
 an integrator; and
 an integration counter;
 wherein the SD-ADC is further configured to capture a value of the decimation counter and a value of the integration counter upon receiving the trigger signal and generate the time stamp based on the captured decimation counter value and the captured integration counter value.

22. The system of claim 18, wherein the memory comprises a circular buffer.

23. The system of claim 18, wherein the memory comprises a first circular buffer and a second circular buffer.

24. The system of claim 23, wherein the capture function element is further configured to write the read out digital value, into the first circular buffer and to write the read out time stamp into the second circular buffer.

25. The system of claim 24, wherein the capture function element is further configured to write digital values read out sequentially into adjacent elements of the first circular buffer and to write timer values read out sequentially into adjacent elements of the second circular buffer.

26. A system comprising:
 a timer;

a control element configured to output a first trigger signal;
a capture function element configured to capture a timer value of the timer when triggered by the first trigger signal and further configured to transfer the captured timer value to a capture register; and
an analog to digital converter (ADC) configured to generate a plurality of ADC values, wherein the ADC is configured to output a second trigger signal to the timer when generating a new ADC value;
wherein the timer is set to a predefined value upon receiving the second trigger signal from the ADC.

* * * * *